(12) United States Patent
Van Der Wilk et al.

(10) Patent No.: US 9,429,857 B2
(45) Date of Patent: Aug. 30, 2016

(54) ELECTROSTATIC CLAMP, LITHOGRAPHIC APPARATUS AND METHOD

(71) Applicant: ASML Netherlands B.V., Veldhoven (NL)

(72) Inventors: Ronald Van Der Wilk, Knegsel (NL); Roger Wilhelmus Antonius Henricus Schmitz, Helmond (NL); Arnoud Willem Notenboom, Rosmalen (NL); Manon Elise Will, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 71 days.

(21) Appl. No.: 14/395,979

(22) PCT Filed: Mar. 19, 2013

(86) PCT No.: PCT/EP2013/055662
§ 371 (c)(1),
(2) Date: Oct. 21, 2014

(87) PCT Pub. No.: WO2013/160026
PCT Pub. Date: Oct. 31, 2013

(65) Prior Publication Data
US 2015/0103325 A1 Apr. 16, 2015

Related U.S. Application Data

(60) Provisional application No. 61/636,988, filed on Apr. 23, 2012.

(51) Int. Cl.
*G03B 27/52* (2006.01)
*G03F 7/20* (2006.01)
*H01L 21/683* (2006.01)

(52) U.S. Cl.
CPC ........ *G03F 7/70708* (2013.01); *G03F 7/70875* (2013.01); *H01L 21/6831* (2013.01)

(58) Field of Classification Search
CPC .............. G03F 7/707; G03F 7/70708; G03F 7/70875; G03F 7/70858; G03F 7/70866; H01L 21/6831; H01L 21/6833
USPC ....... 355/30, 52, 53, 55, 72–77; 250/442.11; 250/492.1, 492.2, 492.22, 493.1, 548; 361/234; 279/128; 269/8
See application file for complete search history.

(56) References Cited

U.S. PATENT DOCUMENTS 4,503,335 A * 3/1985 Takahashi ........... G03F 7/70691
250/548
5,231,291 A * 7/1993 Amemiya ............. G03F 7/2041
250/440.11

(Continued)

FOREIGN PATENT DOCUMENTS

CN 101471278 A 7/2009
EP 1 359 466 A1 11/2003

(Continued)

OTHER PUBLICATIONS

English translation of JP 2003-243371, published on Aug. 29, 2003.*

(Continued)

*Primary Examiner* — Christina Riddle
(74) *Attorney, Agent, or Firm* — Sterne, Kessler, Goldstein & Fox P.L.L.C.

(57) ABSTRACT

An electrostatic clamp (21) configured to hold an object, the electrostatic clamp comprising an electrode (24), a resistive portion (23) formed from a resistive material located on the electrode, and a dielectric portion (22) formed from a dielectric material located on the resistive portion.

8 Claims, 7 Drawing Sheets

(56) References Cited

U.S. PATENT DOCUMENTS

| | | | |
|---|---|---|---|
| 5,764,471 | A | 6/1998 | Burkhart |
| 5,903,428 | A | 5/1999 | Grimard et al. |
| 5,923,521 | A | 7/1999 | Burkhart |
| 6,664,738 | B2 * | 12/2003 | Arai ................ H01J 37/32724 |
| | | | 118/723 R |
| 6,754,062 | B2 | 6/2004 | Logan et al. |
| 7,092,231 | B2 | 8/2006 | Hoeks et al. |
| 7,791,709 | B2 * | 9/2010 | Hennus ............... G03F 7/70341 |
| | | | 355/30 |
| 8,199,454 | B2 | 6/2012 | Koyama et al. |
| 2004/0114124 | A1 | 6/2004 | Hoeks et al. |
| 2006/0033898 | A1 * | 2/2006 | Cadee ................. G03F 7/70341 |
| | | | 355/53 |
| 2006/0087637 | A1 * | 4/2006 | Ottens ................ G03F 7/70341 |
| | | | 355/72 |
| 2007/0153244 | A1 * | 7/2007 | Maria Zaal ......... G03F 7/70341 |
| | | | 355/30 |
| 2008/0151466 | A1 | 6/2008 | Simpson |
| 2009/0159590 | A1 * | 6/2009 | Yonekura .......... H01L 21/67109 |
| | | | 219/520 |
| 2009/0207392 | A1 * | 8/2009 | Rijpma ............... G03F 7/70875 |
| | | | 355/30 |
| 2009/0279061 | A1 * | 11/2009 | Jacobs ................ G03F 7/70341 |
| | | | 355/30 |
| 2011/0164343 | A1 | 7/2011 | Sogard |
| 2012/0013865 | A1 | 1/2012 | Laurent et al. |

FOREIGN PATENT DOCUMENTS

| | | |
|---|---|---|
| JP | 08-031917 A | 2/1996 |
| JP | 2003-243371 A | 8/2003 |
| JP | 3742349 B | 8/2003 |
| JP | 2006-332518 A | 12/2006 |
| WO | WO 2012/005294 A1 | 1/2012 |

OTHER PUBLICATIONS

English translation of JP 2006-332518, published on Dec. 7, 2006.*
International Search Report directed to related International Patent Application No. PCT/EP2013/055662, mailed May 23, 2014; 7 pages.
International Preliminary Report on Patentability and Written Opinion of the International Searching Authority directed to related International Patent Application No. PCT/EP2013/055662, issued Oct. 28, 2014; 9 pages.

* cited by examiner

ELECTROSTATIC CLAMP, LITHOGRAPHIC APPARATUS AND METHOD

FIELD

The present invention relates to an electrostatic clamp for holding an object, a lithographic apparatus and a method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Electrostatic clamps may be used in lithographic apparatuses operating at certain wavelengths, e.g., EUV, since at these wavelengths, certain regions of the lithographic apparatus operates under vacuum conditions. An electrostatic clamp may be provided to electrostatically clamp an object, such as a mask or a substrate (wafer) to an object support, such as a mask table or a wafer table, respectively.

The voltage that is applied to an electrostatic clamp may be considerable. For example, the voltage may be of the order of kilovolts. An insulating barrier is conventionally located over an electrode of an electrostatic clamp, the insulating barrier acting to insulate an object such as a substrate from the voltage applied to the electrode. The insulating barrier may be thin, in order to minimise voltage drop across the insulator. However, the thinness of the insulating barrier may make it susceptible to cracking. If cracking occurs then a discharge between the electrode and the substrate may occur, which may cause damage to the electrostatic clamp and to the substrate. In such circumstances it may be necessary to replace the electrostatic clamp and to discard the substrate.

It is desirable to provide, for example, an improved electrostatic clamp that obviates or mitigates one or more of the problems of the prior art, whether identified herein or elsewhere.

SUMMARY

According to a first an aspect of the invention there is provided an electrostatic clamp configured to hold an object, the electrostatic clamp comprising an electrode, a resistive portion formed from a resistive material located on the electrode, and a dielectric portion formed from a dielectric material located on the resistive portion.

The clamp may further comprise a plurality of burls located on the object receiving side of the electrostatic clamp.

A conductor may be provided on an outermost surface of the burls, such that the conductor is in contact with a clamped object in use.

The conductor may have a resistivity of less than 1 $\Omega$m.

The resistive medium may have a resistance which, taking into account a surface area of the electrode and separation between the resistive portion and a clamped object in use, provides an RC constant of less than 0.1 seconds.

The dielectric medium may have a resistance in excess of $10^{13}\Omega$.

The dielectric portion may be between 2 micron and 100 micron in thickness.

The resistive portion may be between 0.1 mm and 10 mm in thickness.

The clamp may be a bipolar clamp further comprising a second electrode disposed adjacent to the electrode, the second electrode being separated from the electrode, the second electrode being configured to receive a voltage that is of opposite sign to the voltage received by the electrode.

The electrode may be generally rectangular.

The electrode may be generally in the shape of a segment of a circle.

According to a second aspect of the invention there is provided a lithographic apparatus comprising an illumination system constructed and arranged to provide a beam of radiation, and an object support constructed and arranged to support an object in a beam path of the beam of radiation, wherein said object support comprises an electrostatic clamp according to the first aspect of the invention.

According to a third aspect of the invention there is provided a method comprising providing an object, providing a beam of radiation using an illumination system, using an electrostatic clamp to hold an object in a beam path, the clamp comprising a resistive portion formed of a resistive material, a dielectric portion formed of a dielectric material disposed between the resistive portion and the object to be held and an electrode disposed on the opposite surface of the resistive portion to which is adjacent to the dielectric portion; wherein a voltage is applied between the electrode and the object to be held.

The voltage applied to the electrode may be at least 300V.

According to a fourth aspect of the invention there is provided a clamp configured to hold an object, the clamp including an electrode to which a voltage may be applied in order to secure the object to the clamp, the clamp further including a cooling fluid conduit having an inlet and an outlet, wherein the clamp is provided with a heater which is configured to locally heat part of the cooling fluid conduit.

The heater may be configured to locally heat part of the cooling fluid conduit which is adjacent to the inlet.

The heater may be located adjacent to an inlet of the cooling fluid conduit.

The heater may extend through 90° or more, measured around the clamp from the centre of the clamp. The heater may extend through up to 180°, measured around the clamp from the centre of the clamp.

The heater may be located between the cooling fluid conduit and an electrode of the clamp. The electrode may be the electrode which is used to secure the object.

The clamp may be a Johnsen-Rahbek clamp. The clamp may be an electrostatic clamp. The clamp may be a clamp according to the first aspect of the invention.

According to a fifth aspect of the invention there is provided a method of cooling a clamp configured to hold an object, the clamp including an electrode to which a voltage may be applied in order to secure the object to the clamp, the method comprising passing cooling fluid into an inlet of a cooling fluid conduit and removing hot cooling fluid from an outlet of the cooling fluid conduit, the method further comprising using a heater to locally heat the cooling fluid.

The heater may be used to locally heat the cooling fluid adjacent to the inlet.

The heater may reduce a temperature gradient between cooling fluid adjacent to the inlet and cooling fluid which is approaching the outlet.

According to a sixth aspect of the invention there is provided a lithographic apparatus comprising an illumination system constructed and arranged to provide a beam of radiation, and an object support constructed and arranged to support an object in a beam path of the beam of radiation, wherein the object support comprises a clamp according to the fourth aspect of the invention.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
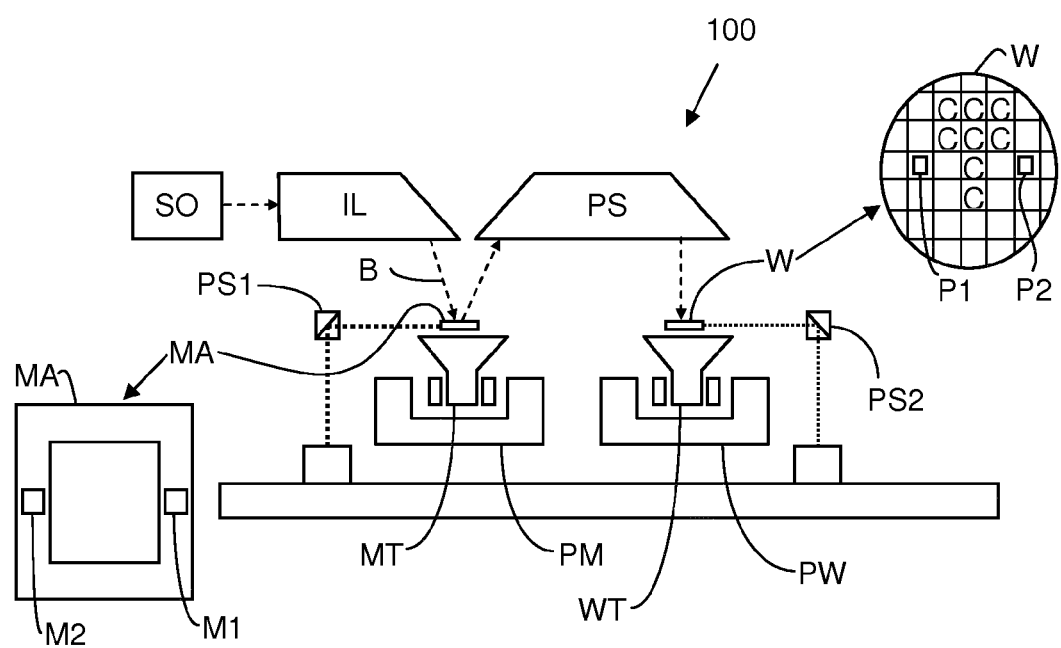
FIG. 1 schematically depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

FIG. 1 schematically depicts a lithographic apparatus 100 including a source collector apparatus SO according to one embodiment of the invention. The apparatus comprises:

- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin that has one or more emission lines in the EUV range. The electrical discharge may be generated by a power supply, which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
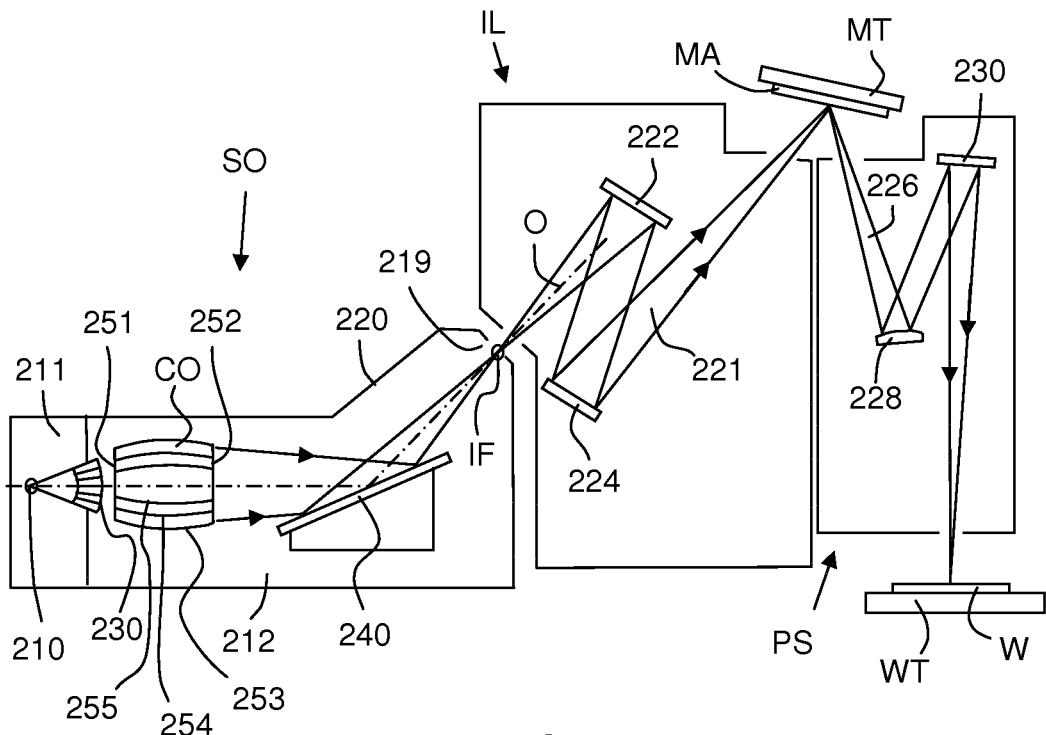
FIG. 2 is a more detailed schematic view of the lithographic apparatus.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO that may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
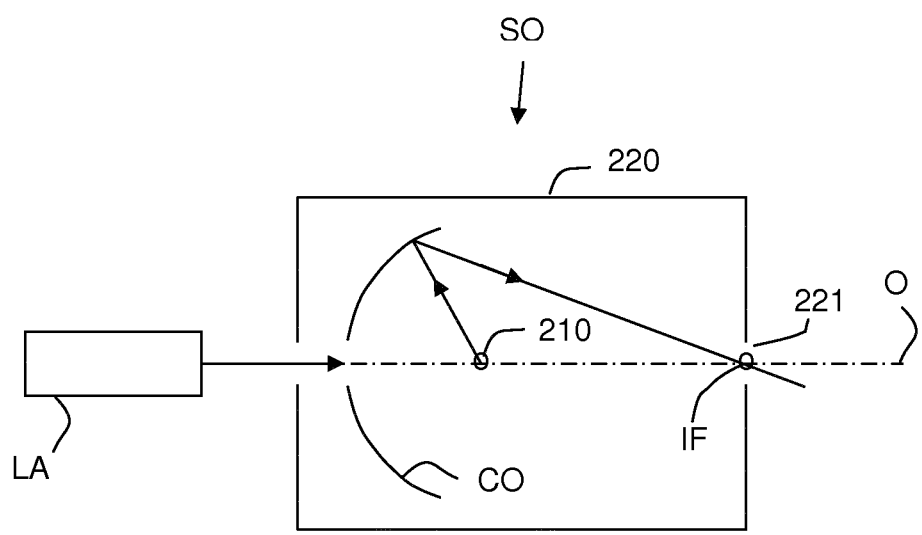
FIG. 3 is a more detailed schematic view of the source collector apparatus SO of the apparatus of FIGS. 1 and 2.

Alternatively, the source collector apparatus SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
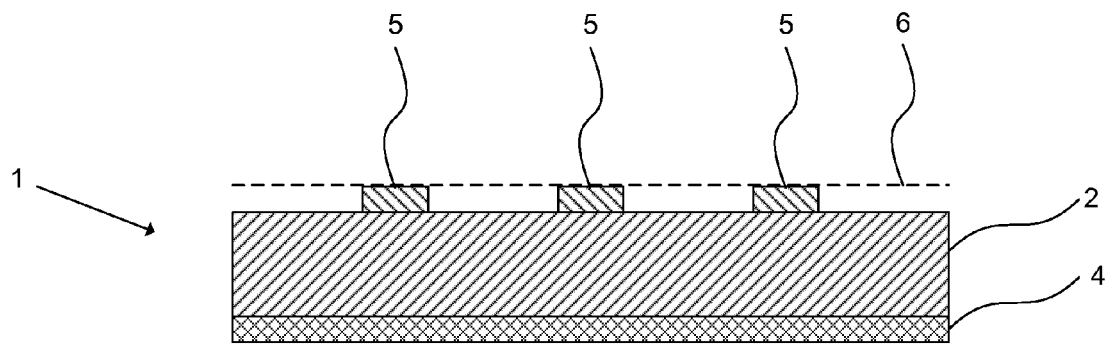
FIG. 4 schematically shows in cross-section part of a prior art electrostatic clamp.

FIG. 4 depicts in cross-section part of an electrostatic clamp 1 according to the prior art, which may be used to clamp an object such as a mask (or other patterning device) or wafer (or other substrate). The clamp 1 comprises a dielectric portion 2 formed from a dielectric material, and an electrode 4. A plurality of burls 5 are located on an upper surface of the dielectric portion 2. The burls 5 may be formed from a dielectric material. Upper surfaces of the burls determine a plane 6 at which a lower surface of an object (not shown) is to be held. The electrode 4 is provided on an opposing surface of the dielectric portion 2 to the burls 5.

The electrode 4 is configured to be held at a voltage to generate an electrostatic clamping force between the clamp 1 and an object. The object may be held in plane 6 by an electrostatic clamping force when a voltage is applied to the electrode 4. The electrostatic or Coulomb clamping force can be related to the applied voltage according to the formula:

$$P = \tfrac{1}{2} \in_0 \in_R E^2 \qquad (1)$$

where:

P is the Coulomb clamping pressure exerted on the object to be clamped;

$\in_0$ is the vacuum dielectric constant ($8.854 \times 10^{-12}$); and

E is the electrical field strength experienced by the clamped object.

The electrical field strength E is proportional to the voltage V at a surface of the clamp from which the electrical field extends (in this case the upper surface of the dielectric portion 2), and is inversely proportional to the gap g between the surface from which the field extends and the clamped object (in this case the gap g is equal to the height of the burls 5.

Clamping force can be increased by reducing the thickness of the dielectric portion 2, reducing the separation between the plane 6 in which the object is to be clamped and the electrode 4 and increasing the capacitance of the dielectric portion. However, as the thickness of the dielectric portion 2 is reduced, this increases the risk of breakdown causing a short-circuit between the electrode 4 and the object being clamped or, if the burls 5 are conductive or coated with a conductor (and connected to ground), between the electrode 4 and the burls 5. If a short-circuit or any significant discharge occurs between the electrode 4 and an grounded part of the system, then the voltage between the electrode 4 and the object may fall, and clamping force may be significantly reduced as it depends on the square of the voltage. Damage may also be caused to the electrostatic clamp 1.

Figure 5:
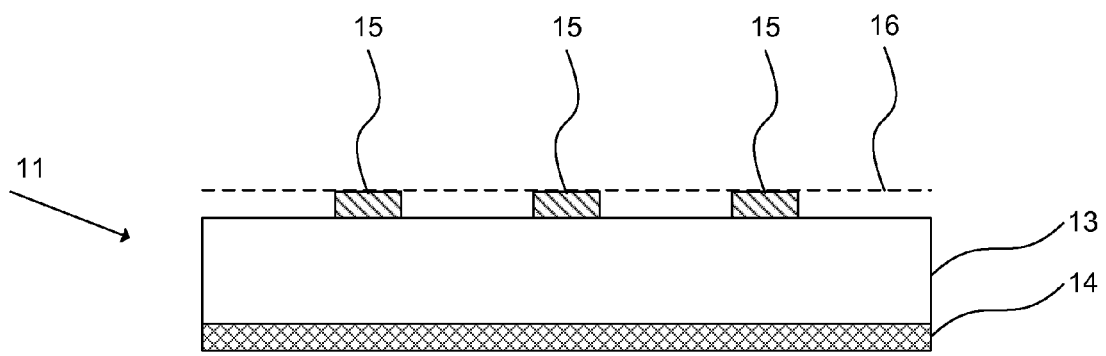
FIG. 5 schematically shows in cross-section part of a different prior art electrostatic clamp.

FIG. 5 depicts in cross-section part of an alternative electrostatic clamp 11 according to the prior art, which may be used to clamp an object such as a mask (or other patterning device) or wafer (or other substrate). Clamps of this type are sometimes referred to as clamps. The clamp 11 comprises a resistive portion 13 formed from a resistive material, and an electrode 14. A plurality of burls 15 are located on an upper surface of the resistive portion 13. The burls 15 are formed from a resistive material (e.g., the same material as the resistive portion 13). Upper surfaces of the burls 15 determine a plane 16 at which a lower surface of an object (not shown) is to be held. The electrode 14 is provided on the opposing surface of the resistive portion 13 to the burls 15.

The electrode 14 is configured to be held at a voltage to generate an electrostatic clamping force between the clamp 11 and an object. The object may be held in plane 16. Current flow between the burls 15 and the clamped object will give rise to the effect, which will pull the burls and the clamped object together.

It is possible to provide a conductive coating to upper surfaces of the burls 15, the conductive coating being connected to ground. If this is done then current does not flow from the burls to the clamped object and the effect does not provide clamping force. Electrostatic clamping force resulting from Coulomb's law (see equation (1) further above) clamps the object to the electrostatic clamp 11 when a voltage is applied to the electrode 14. The force exists in regions between the burls 15, but does not exist at the burls themselves since these are connected to ground. The voltage on the upper surface of the resistive portion 13 falls away in the vicinity of the burls 15 due to current flow through the burls. Thus, the force applied to the object also falls away in the vicinity of the burls 15.

Figure 6A:
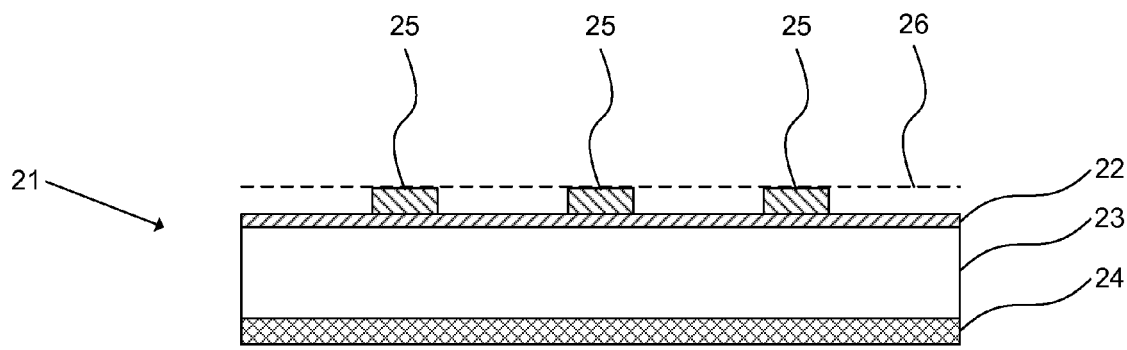
FIG. 6a and 6b schematically show in cross-section and viewed from above part of an electrostatic clamp according to an embodiment of the invention.

FIG. 6 depicts schematically in cross-section and viewed from above part of an electrostatic clamp 21 according to an embodiment of the invention, which may be used to clamp an object such as a mask (or other patterning device) or wafer (or other substrate). The clamp 21 comprises a dielectric portion 22 formed from a dielectric material, a resistive portion 23 formed from a resistive material, and an electrode 24. The electrode 24 is provided on an opposing surface of the resistive portion 23 from the dielectric portion 22. The electrode is configured to be held at a voltage to generate an electrostatic clamping force between the clamp 21 and the object. A plurality of burls 25 are provided on the dielectric portion 22. Upper surfaces of the burls 25 determine a plane 26 in which the object (not shown) is to be held. The dielectric layer 22 may be provided under the burls 25 (as illustrated) or may be provided on top of the burls. The terms "upper" and "lower" in the context of the electrostatic clamp 21 are descriptive of features of the electrostatic clamp when it is in the orientation shown in FIG. 6. The electrostatic clamp may have any suitable orientation in use.

Figure 6B:
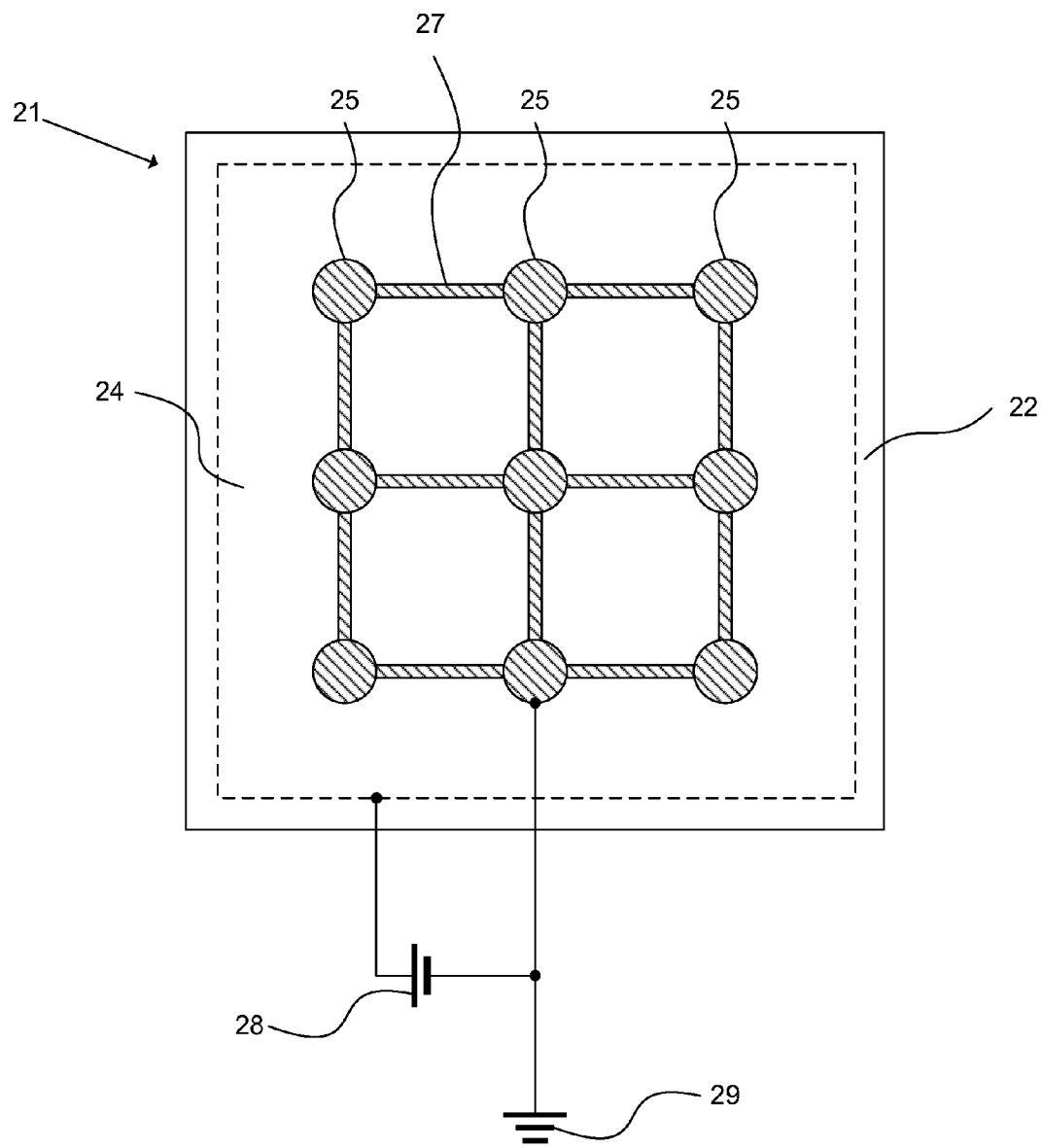

As may be seen from FIG. 6b, the burls 25 are connected by conductor lines 27 to each other and to ground 29. Ground 29 may be at zero volts, or may be a fixed non-zero voltage. As may also be seen from FIG. 6b, the electrode 24 (which is shown with a dotted line because it is on an opposite side of the electrostatic clamp 21 from that shown) is connected to a voltage source 28. The voltage source 28 applies a desired voltage to the electrode 24 (e.g., of the order of kV). Coulomb force will clamp the object to the electrostatic clamp 21. The coulomb force may be sufficiently strong that contamination particles are crushed by the object when it is clamped to the electrostatic clamp 21.

The resistive portion 23 may for example be formed from ceramic. The resistive portion 23 may for example be formed by sintering sheets of ceramic together in order to form a ceramic layer having a desired thickness. This process may cause the resistive portion to have an uneven surface. Consequently, a sufficient number of ceramic sheets may be sintered together to provide the ceramic with excess thickness, following which grinding may be used to improve the flatness of the surface of the ceramic (the grinding also reducing the thickness of the ceramic to a desired thickness). The ceramic may for example have a thickness of 1 mm. The ceramic may for example have a thickness that is 0.1 mm or more. The ceramic may for example have a thickness that is 10 mm or less.

The dielectric portion 22 may for example be formed from quartz, or may be formed from any suitable insulator. The electrode 24 may for example be formed from chromium or aluminium, or some other suitable conductor. If manufacturing of the electrostatic clamp 21 is at high temperatures, then the electrode 24 may be formed from a metal with a high melting temperature such as tungsten or molybdenum (or from some other suitable conductor such as a composite material). The electrostatic clamp may be formed from a metal nitride. The conductor lines 27 may similarly be formed from chromium, aluminium, tungsten, molybdenum, a metal nitride, a composite material or some other suitable conductor.

The voltage at any point on the surface of the resistive portion 23 will be substantially the same as that applied to the electrode 24, provided that no significant current flows through the resistive portion 23 (as may be expected to be the case). The voltage on the upper surface of the dielectric portion 22 may be determined by treating the dielectric portion and the gap between the dielectric portion and the clamped object as capacitors in series according to the formula:

$$V_S = \frac{C_d}{(C_v + C_d)} \quad (2)$$

where $V_s$ is the voltage on the upper surface of the dielectric portion, $C_d$ is the capacitance of the dielectric portion 22, and $C_v$ is the capacitance of the gap between the dielectric portion and the clamped object. The force effective between the clamp 21 and the clamped object is defined by the relationship given in equation (1).

The dielectric portion 22 may be thinner than the dielectric portion of the prior art electrostatic clamp 1 shown in FIG. 4 because the dielectric portion 22 is structurally supported by the resistive portion 23. The dielectric portion 22 may for example have a thickness of 10 microns or less, and may for example have a thickness of 5 microns or more (or may have some other thickness). Referring to Equation (2), it may be seen that increasing the capacitance of the dielectric portion 22 by making it thinner will increase the voltage $V_s$ on the upper surface of the dielectric portion. Consequently, for a given voltage applied to the electrode 24, when the dielectric portion 22 is made thinner a greater force is applied to the object than would be applied by the prior art electrostatic clamp 1. Conversely, the same force as is applied by the prior art electrostatic clamp 1 may be generated using a lower voltage at the electrode 24 when the dielectric portion 22 is made thinner.

A further advantage of the embodiment shown in FIG. 6 compared with the prior art electrostatic clamp shown in FIG. 4 is that if the dielectric portion 22 suffers from a crack or defect, the presence of the resistive portion 23 between the electrode 24 and the object being clamped will result in only a small current flowing to the object. Consequently, damage of the clamp due to electrical discharge is likely to be avoided, and it may be possible to continue to use the clamp. Damage to the voltage source 28 may similarly be avoided. Any reduction in clamping pressure resulting from a defect will be localised and may not be fatal to the operation of the electrostatic clamp 21.

As mentioned further above, the dielectric layer 22 may be provided under the burls 25 (as illustrated) or may be provided on top of the burls. The burls 25 may be formed from any suitable material.

In embodiments in which the burls are provided on top of the dielectric layer 22, the burls 25 may for example be formed from conductive material, and may for example be connected to ground by conductor lines 27. Alternatively, the burls may for example be formed from resistive or dielectric material, and may be provided with a conductive coating and connected to ground by conductor lines 27.

In embodiments in which the burls are provided beneath the dielectric layer 22 a conductive coating may be provided on top of the burls (on top of the dielectric layer), the conductive coating being connected by conductor lines 27. The burls may for example be formed from dielectric material, or from any other suitable material.

Figure 7:
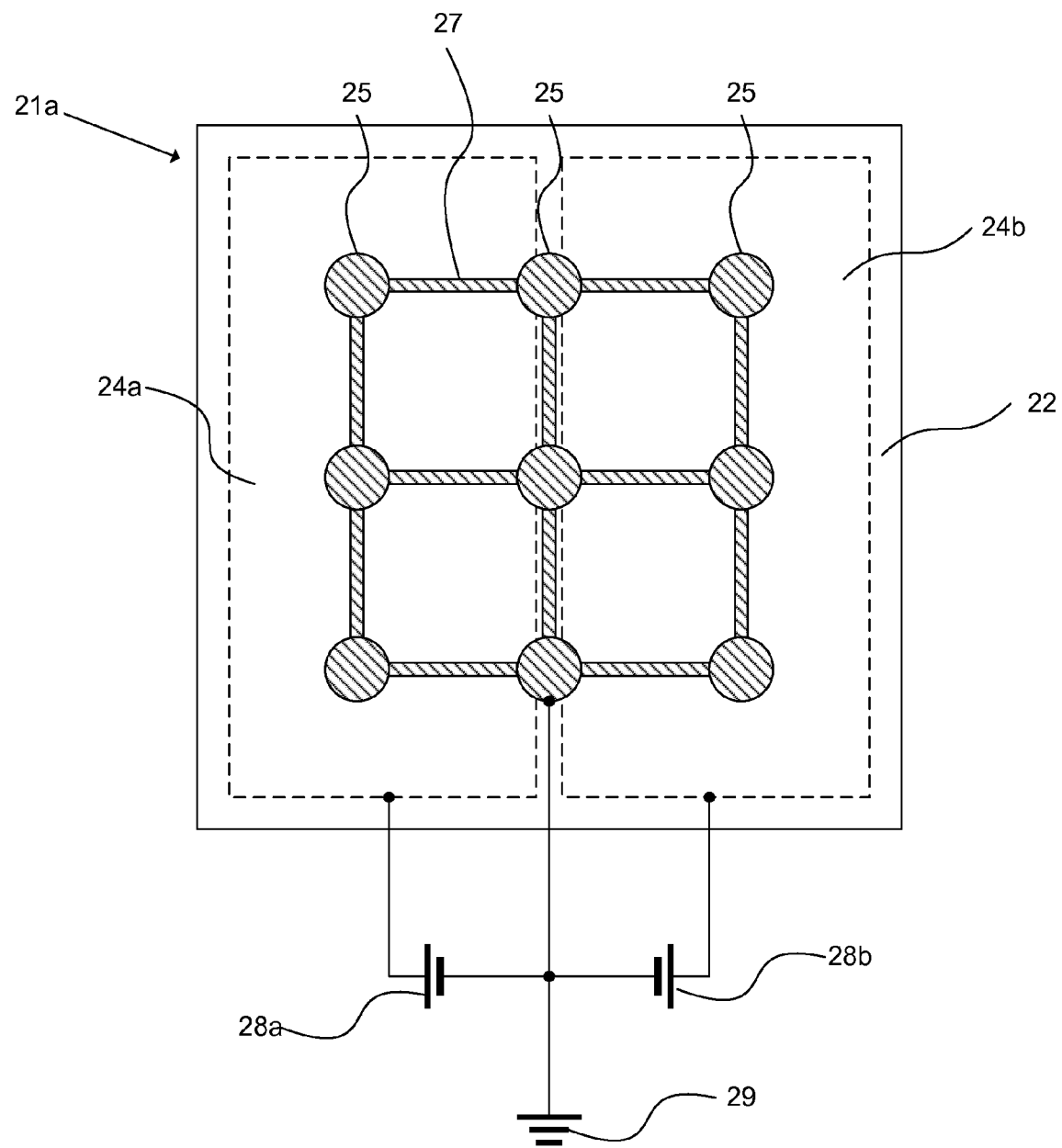
FIG. 7 schematically shows viewed from above part of an electrostatic clamp according to an alternative embodiment of the invention.

FIG. 7 shows a plan view of an electrostatic clamp 21a according to an embodiment of the invention that may be used to clamp an object such as a mask (or other patterning device) or wafer (or other substrate). The electrostatic clamp 21a has a cross-sectional construction, which corresponds generally with that shown in FIG. 6a. However, the electrostatic clamp 21a is a bipolar clamp. The bipolar clamp 21a comprises a pair of electrodes 24a, 24b (illustrated by dotted lines) instead of the single electrode 24 shown in FIG. 6. The electrodes 24a and 24b are held at voltages that are the same magnitude as each other, but of opposing signs with respect to each other, by voltage sources 28a and 28b respectively. In common with the embodiment shown in FIG. 6, the burls 25 are connected by conductor lines 27 to each other and to ground 29. The burls 25 may be formed from conductive material, or may be formed from insulating material or resistive material and provided with a coating of conducting material. The dielectric layer 22 may be provided under the burls 25 (as illustrated) or may be provided on top of the burls. In either case, the uppermost surface on the burls 25 (i.e., which comes into contact with a clamped object in use) may be conducting and may be connected to ground.

The bipolar electrostatic clamp 21a shown in FIG. 7 is advantageous compared with for example some prior art bipolar electrostatic clamps. In some prior art bipolar electrostatic clamps there may be a discrepancy between current transfer from one electrode to the clamped object and current transfer from the other electrode to the clamped object. This discrepancy may cause the clamped object to become charged over time. The bipolar electrostatic clamp 21a shown in FIG. 7 avoids this undesirable accumulation of charge at the clamped object because the dielectric layer 22 prevents charge from passing to the clamped object.

Figure 8:
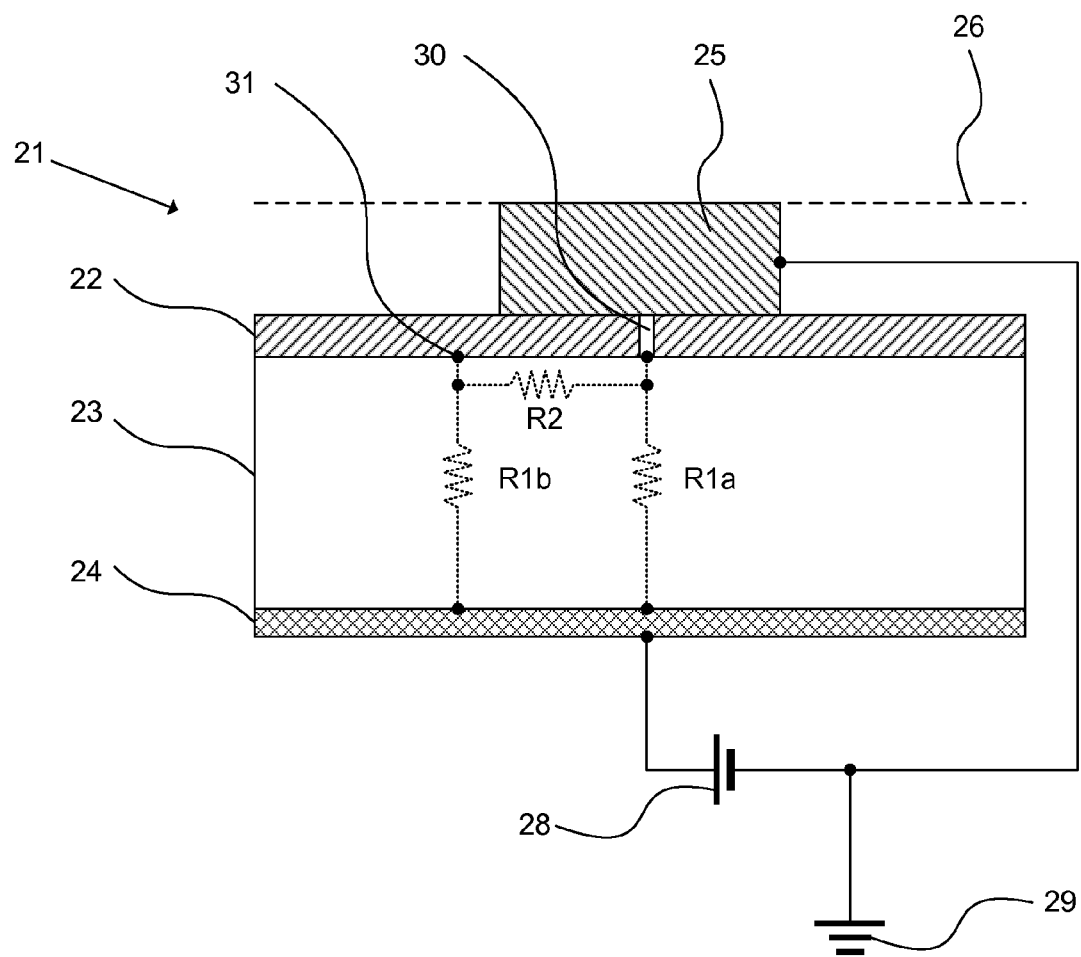
FIG. 8 schematically shows in cross-section part of the electrostatic clamp of FIG. 6 with a defect present in a dielectric layer of the electrostatic clamp.

FIG. 8 depicts in cross section part of the electrostatic clamp 21 shown in FIG. 6 in which a defect 30 is present in the dielectric portion 22. The defect 30 in the dielectric portion 22 connects the resistive portion 23 to the burl 25, which is conductive and which is connected to ground 29. It will be understood that the defect 30 provides a low resistance path between the surface of the resistive portion 23 and the burl 25 in the immediate proximity of the defect 30. The potential at the defect 30 will be zero, and the clamping force in this region will be reduced accordingly.

The potential at another location 31 on the surface of the resistive portion 23 will be defined by the ratio of the resistance between the location 31 and the electrode 24, here shown as resistance R1b, and the resistance between the location 31 and the defect 30, here shown as resistance R2. It will be understood that the resistances R1b and R2 are an approximation, as the resistive portion 23 acts as a distributed resistor. However, the distance between any two locations within the resistive portion 23 will have a finite resistance, which will increase in proportion to the distance between those locations.

Therefore, if a defect 30 occurs in the dielectric portion 22 as shown, and some location on the surface of resistive portion 23 becomes coupled to ground 29 via burl 25, the potential at a location 31 on the surface of the resistive portion 23 is defined by the ratio of the resistances of the first resistor R1b and the second resistor R2 as described in the equation:

$$V_{31} = \frac{R_2}{R_{1b} + R_2} \times V_S \quad (2)$$

where:
$V_{31}$ is the voltage at the location 31;
$R_{1b}$ is the resistance of the resistive portion 22 between the electrode 24 and the location 31;
$R_2$ is the resistance of the resistive portion 22 between the location 31 and the defect 30; and
$V_S$ is the voltage supplied by the voltage supply 28.

The surface potential at the location 31 may be reduced by the defect 30. However, as the distance between the location 31 and the defect 30 becomes comparable to the thickness of the resistive portion 23, then the surface voltage at the location 31 will be approximately half of the voltage at the electrode 24. As the distance between the location 31 and the defect 30 becomes greater than the thickness of the resistive portion 23, then the surface voltage at location 31 will approach the voltage at the electrode 24. In this way, the presence of the resistive portion 23 between the electrode 24 and the dielectric portion 22 ensures that any defect such as defect 30 will only have a local effect on the voltage at the surface of the resistive portion 23, and hence will only have a local effect on the effective clamping pressure between the clamp 21 and the object.

The selection of resistive material forming the resistive portion 23 of embodiments of the invention may be made with consideration of the effect of the resistive material upon switching speed. While it is beneficial to use as large a resistor as possible, resulting in reduced current to any defect and therefore reduced power dissipation, a larger resistance will contribute to an increased response time. This may be illustrated by the worked example below.

Referring to FIG. 7, the second electrode 26b, may have an area of approximately 35000 mm². For simplicity, in this worked example the dielectric may be assumed to be sufficiently thin that it does not have an effect on the charge/discharge time (in practice it may add around 30% to the charge/discharge time). The gap between the second electrode and the top of the burls (and hence the bottom of a clamped object) may be 10 microns. The capacitor established by the electrode 26b and gap may have a capacitance of 30 nF. An RC constant of less than 0.1 seconds may be desired (in order for example to be sure that discharge will occur within 0.5 seconds). Thus, it may be desirable that the resistance provided by the resistive portion at the second electrode 26b is less than 3 MΩ. This value may be used, in conjunction with the thickness of the resistive portion 23, to determine what resistivity is desired from the resistive material used to form the resistive portion. The resistive material may for example have a resistivity of the order of $10^9$ Ωm (for example if the resistive material has a thickness of the order of 1 mm). The resistive material may for example have a resistivity of the order of $10^8$ Ωm (for example if the resistive material has a thickness of the order of 0.1 mm).

As mentioned further above, the dielectric portion 22 may for example be formed from quartz, or may be formed from any suitable insulator. The material used to form the dielectric portion 22 may have a resistivity that is orders of magnitude greater than the resistivity of the material used to form the resistive portion 23. The resistance of the dielectric portion 22 may for example be in excess of $10^{13}$Ω (e.g., a resistivity in excess of $10^{16}$Ω if the dielectric portion has a thickness of 10 microns). The dielectric portion 22 may be considered to be an insulator. The dielectric portion 22 may have a resistance that gives rise to an RC time for accumulation of charge on the outer surface of the dielectric portion 22, which is in excess of 1000 seconds.

The dielectric portion 22 may have a thickness of 2 microns or more (charge breakthrough may occur for thicknesses less than this). The dielectric portion 22 may have a thickness of up to 100 microns (although it may be made thicker than this the clamping force provided by the electrostatic clamp will be reduced).

The resistivity of the dielectric portion 22 may be at least two orders of magnitude greater than the resistivity of the resistive portion 23.

The resistivity of the conductor on the burls 25 may be less than 1 Ωm.

The dielectric portion 22 may for example have a permittivity that is between around 2 and around 5.

The height of the burls 25 may for example be between 5 and 1000 microns. The height of the burls may for example be up to 200 microns (burl heights of this order may be used in immersion lithography substrate tables). The height of the burls 25 may be selected to allow accommodation of contamination particles of a given diameter. The height of the burls may be chosen as desired based upon the manner in which the electrostatic clamp is intended to be used.

Any suitable number of burls may be provided on the electrostatic clamp. The burls may for example be separated by 2.5 mm (or may have some other separation). The burls may be provided in a grid arrangement, or any other suitable arrangement.

In an embodiment, the electrostatic clamp may have no burls. Where this is the case, a conductor may be provided on top of the dielectric layer. The conductor may for example be arranged in a grid, or may be provided in some other arrangement.

The electrostatic clamp may be configured to provide a minimum clamping pressure of 50 mbar. If the height of the burls is 10 microns, then the voltage applied to the electrode may be at least 300V. Higher or lower voltages may be applied to the electrode. For example up to 1000V or more may be applied to the electrode.

The electrostatic clamp may have any suitable shape. The electrostatic clamp may for example be rectangular, and may thus be suitable for clamping a mask (or other rectangular object). The electrostatic clamp may for example have the general shape of a segment of a circle, and may thus be suitable for clamping a wafer (or other circular substrate).

In the above description reference has been made to ground 29. Ground 29 may be at zero volts or may have some other fixed voltage (voltages applied to the electrode(s) being determined relative to that fixed voltage). An advantage of ground 29 being at zero volts is that it may be connected to parts of the lithographic apparatus.

In an embodiment, a conduit may be provided inside the clamp through which cooling fluid such as water may be circulated.

The dielectric portion 22 of the electrostatic clamp may comprise a single layer of dielectric. Alternatively, the dielectric portion may comprise two or more stacked layers of dielectric.

In an embodiment, the clamp may be double sided. For example, two electrodes spaced apart may be provided within the resistive portion 23, with the insulating portion being provided both on the top and the bottom surfaces of the resistive portion. The double sided clamp may provide clamping on one side to a substrate table, and clamping on an opposite side to a substrate (or other object).

Figure 9:
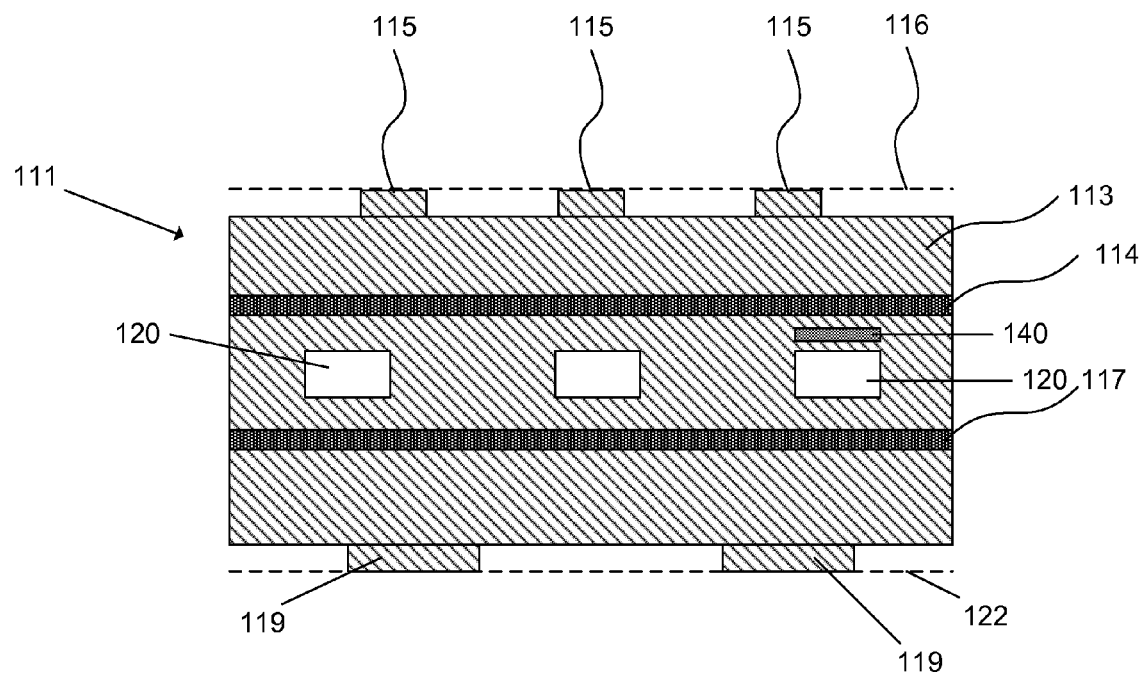
FIG. 9 schematically shows in cross-section part of a clamp according to an alternative embodiment of the invention.

FIG. 9 schematically depicts in cross-section part of a Johnsen-Rahbek clamp 111 according to an embodiment of the invention. The Johnsen-Rahbek clamp may be used to clamp an object such as a mask (or other patterning device) or a wafer (or other substrate). The clamp 111 comprises resistive material 113 within which first and second electrodes 114, 117 are provided. The resistive material 113 may, for example, be AlN or may be any other suitable material. Cooling fluid conduit 120 through which cooling liquid is passed during use is located in the resistive material 113. The cooling fluid conduit, which appears to be three separate conduits in FIG. 9 but is in fact a single conduit, is described further below.

A plurality of burls 115 are located on an upper surface of the resistive material 113. The burls 115 are formed from a resistive material (e.g. the same material as the resistive portion 113). Upper surfaces of the burls 115 determine a plane 116 at which a lower surface of an object (not shown) is held in use. Although only three burls are shown, a multiplicity of burls may be provided on the clamp 111. The burls 115 may be distributed across the upper surface of the clamp 111.

Feet 119 are provided on a lower surface of the resistive material 113. The feet may be formed from a resistive material (e.g. the same material as the resistive material 113). The feet 119 may, in a similar manner to the burls, establish a plane 122 at which the clamp 111 makes contact with a substrate table WT in use (see FIGS. 1 and 2). Although only two feet 119 are shown, a multiplicity of feet may be provided on the clamp 111. The feet 119 may be distributed across the lower surface of the clamp 111.

In use, the clamp 111 is positioned on a substrate table WT and a voltage is applied to the second electrode 117. Current flow between the clamp 111 and the substrate table WT gives rise to the Johnsen-Rahbek effect. This pulls the clamp 111 and the substrate table WT together, thereby securing the clamp on the substrate table. When a substrate is to be exposed, the substrate is positioned on top of the burls 115 and a voltage is then applied to the first electrode 114. Current flow from the first electrode 114 to the substrate gives rise to the Johnsen-Rahbek effect. This pulls the substrate onto the clamp 111, thereby securing the substrate to the clamp.

The resistivity of the resistive material 113 is high, and as a result current which flows from the electrodes 114, 117 through the resistive material will cause significant heating of the resistive material. Water (or other liquid) is passed through the cooling fluid conduit 120 in order to remove some of this heat from the clamp 111.

Figure 10:
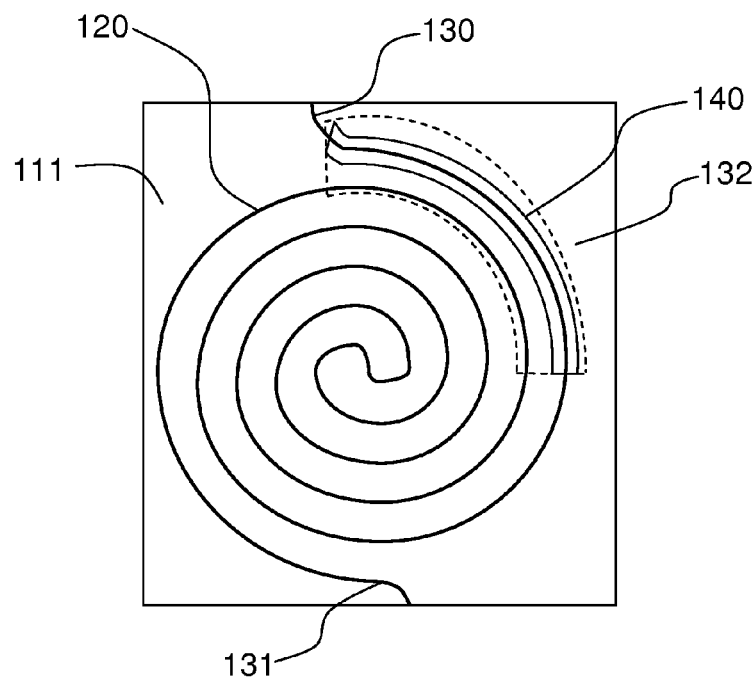
FIG. 10 shows schematically in cross-section viewed from above, the clamp shown in FIG. 9.

FIG. 10 shows schematically the clamp 111 in cross-section viewed from above, the cross-section cutting through the cooling fluid conduit 120. As can be seen from FIG. 10, the cooling fluid conduit 120 may be in the form of a single conduit which starts at an outer edge of the clamp 111, spirals inwardly towards the centre of the clamp and then spirals outwardly towards the outer edge of the clamp. In the embodiment shown in FIG. 10, an inlet 130 of the cooling fluid conduit 120 is on an opposite side of the clamp 111 from an outlet 131 of the cooling fluid conduit.

The Johnsen-Rahbek effect gives rise to a substantial amount of heat in the clamp 111. For this reason, the temperature of the fluid at the outlet 131 is significantly higher than the temperature of the fluid at the inlet 130. Fluid which enters the inlet 130 passes close to fluid which has nearly reached the outlet 131. A region in which this occurs is indicated by dashed-line 132. This would give rise to an undesirable temperature gradient between portions of the cooling fluid conduit 120 which are located the region 132. That is, an undesirable temperature gradient would be seen between cooling fluid conduit portions where unheated fluid passes close to fluid which has nearly reached the outlet (the fluid which has nearly reached the outlet has been heated by the clamp 111). The temperature gradient is undesirable because it will cause distortion of a wafer held on the wafer clamp 111 in the vicinity of the temperature gradient. Although it may be possible to some extent to correct for wafer distortion caused by the undesirable temperature gradient, via adjustment of mirrors or other optics of a lithographic apparatus, it might not be possible to provide a sufficiently effective amount of correction in this manner. For example, the overlay of a projected pattern (i.e. the degree to which a projected pattern aligns with a pattern on a wafer) may fail to correspond with a desired overlay.

In the embodiment of the invention shown in FIGS. 9 and 10, this problem is addressed by providing a heater 140 in the clamp 111. The heater 140 may for example be an electrical heater (e.g. a metal plate which is heated by passing a an electric current through it). The heater 140 extends around approximately the first 90° of the cooling fluid conduit 120 adjacent to the inlet 130. The 90° angle is measured around the clamp 111 from the centre of the clamp, with 0° being approximately the location of the inlet 130. The heater 140 is located between the cooling fluid conduit 120 and the first electrode 114 in this embodiment. The heater is used to heat the fluid passing through the cooling fluid conduit 120, thereby increasing the temperature of the fluid in the cooling fluid conduit. This is advantageous because it reduces the temperature gradient between the portions of the cooling fluid conduit 120 in the region enclosed by the dashed-line 132. Although some temperature gradient will remain, the temperature gradient is reduced significantly, and it may be possible to correct for wafer distortion caused by the remaining temperature gradient using mirrors or other optics of the lithographic apparatus. This may allow an overlay to be achieved which corresponds with a desired overlay.

Although the heater 140 is shown in FIG. 9 as in between the cooling fluid conduit 120 and the first electrode 114, the heater 140 may alternatively (or additionally) be located between the cooling fluid conduit and the second electrode 117. The heater 140 may be provided at any suitable position within the clamp 111. The heater may be positioned such that it heats fluid adjacent to the inlet 130, thereby reducing the temperature gradient between fluid adjacent to the inlet and fluid which is approaching the outlet. The heating provided by the heater 140 is localised. That is, the heater 140 raises significantly the temperature of the resistive material 113 in the vicinity of the heater, but does not for example significantly raise the temperature of the resistive material 113 in other parts of the clamp 111.

The term "fluid which is approaching the outlet" may be considered, for example, to mean fluid which has already traveled through at least approximately three-quarters of the length of the cooling fluid conduit 120. The term "adjacent to the inlet" is not intended to mean within a particular distance from the point at which fluid enters the clamp 111. The term "adjacent to the inlet" may refer to a location where fluid which has entered the clamp 111 first travels close to fluid which has passed through a substantial portion of the clamp and which is therefore considerably hotter (e.g. as shown in FIG. 10).

The resistive material 113 may be formed from laminated layers of AlN. The heater 140 may be provided between two layers of AlN during fabrication of the clamp 111.

An advantage of embodiments of the invention described in connection with FIGS. 9 and 10 is that the reduction of the temperature gradient between adjacent portions of the cooling fluid conduit 120 may be sufficiently large that it allows more flexibility in the choice of resistive material 113 which may be used to form the clamp 111. That is, because a problematic temperature gradient has been reduced, a resistive material which a higher resistivity may be used without increasing the temperature gradient to such an extent that it can no longer be compensated for. Embodiments of the invention may allow more flexibility in the cooling liquid which is used. This is because the heat capacity of the cooling liquid which is needed to prevent an undesirably large temperature gradient in the clamp 111 is reduced.

Although FIG. 10 shows the heater 140 extending around approximately the first 90° of the cooling fluid conduit 120 adjacent to the inlet 130, the heater 140 may extend around some other portion of the cooling fluid conduit adjacent to the inlet 130. For example, the heater 140 may extend around more than the first 90° of the cooling fluid conduit, e.g. approximately the first 180° of the cooling fluid conduit 120 adjacent to the inlet 130. The heater 140 may extend around any suitable portion of the cooling fluid conduit 120. The heater 140 may be positioned such that it heats the cooling liquid after it has entered the clamp 111 (the heater is located in or on the clamp). The heater 140 is provided adjacent to the inlet 130 (e.g. as shown in FIG. 10, or nearer to or further from the inlet than is shown in FIG. 10). Providing localised heating of the cooling liquid in the clamp 111 at a location where the cooling liquid passes close to hot cooling liquid reduces the temperature gradient in the clamp.

The cooling liquid may for example be water, or may be any other suitable liquid. The heat received by the cooling liquid as it passes through the cooling fluid conduit 120 may be sufficient that some of the liquid may become gas before it reaches the outlet 131.

Although a spiral cooling fluid conduit 120 is shown in FIG. 10, the cooling fluid conduit may have any suitable configuration. Although one cooling fluid conduit 120 is shown in FIG. 10, more than one cooling fluid conduit may be provided in the clamp. Where more than one cooling fluid conduit is provided, each cooling fluid conduit may be provided with a heater.

The heater may be used to locally heat any part of the cooling fluid conduit. For example, the heater may be used to locally heat a part of the cooling fluid conduit where a temperature gradient exists which it is desired to reduce (e.g. a temperature gradient which cannot be compensated for sufficiently well using other means such as lens or mirror adjustment). More than one heater may be used, for example to locally heat different parts of the cooling fluid conduit.

Although the embodiment of the invention shown in FIGS. 9 and 10 has been described in the context of a Johnsen-Rahbek clamp, the invention may be used in any suitable clamp. The invention may, for example, be used in an electrostatic clamp, or in a clamp of the type described further above in conjunction with FIGS. 6-8.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may be made in this text to the use an electrostatic clamp in lithographic apparatuses, it should be understood that the electrostatic clamp described herein may have other applications, such as for use in mask inspection apparatuses, wafer inspection apparatuses, aerial image metrology systems and more generally in any systems that measure or process an object such as a wafer (or other substrate) or mask (or other patterning device) either in vacuum or in ambient (non-vacuum) conditions, such as, for example in plasma etchers or deposition apparatuses.

The terms "radiation" and "beam" as used herein encompass all types of electromagnetic radiation, including ultraviolet (UV) radiation (e.g., having a wavelength of or about 365, 355, 248, 193, 157 or 126 nm) and extreme ultraviolet (EUV) radiation (e.g., having a wavelength in the range of 5-20 nm), as well as beams of charged particles, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The description is not intended to limit the invention.

The invention claimed is:

1. A clamp configured to hold an object, the clamp comprising:
    an electrode to which a voltage may be applied in order to secure the object to the clamp; and
    a cooling fluid conduit having an inlet and an outlet,
    wherein the clamp is provided with a heater configured to locally heat part of the cooling fluid conduit, and
    wherein the heater is configured to locally heat part of the cooling fluid conduit that is only adjacent to the inlet, thereby reducing a temperature gradient between fluid adjacent to the inlet and fluid that is approaching the outlet.

2. The clamp of claim 1, wherein the heater is located adjacent to an inlet of the cooling fluid conduit.

3. The clamp of claim 2, wherein the heater extends through approximately 90°, measured around the clamp from the center of the clamp.

4. The clamp of claim 1, wherein the heater is located between the cooling fluid conduit and an electrode of the clamp.

5. The clamp of claim 1, where in the clamp is a Johnsen-Rahbek clamp or is an electrostatic clamp.

6. A lithographic apparatus comprising an illumination system constructed and arranged to provide a beam of radiation, and an object support constructed and arranged to support an object in a beam path of the beam of radiation, wherein the object support comprises a clamp according to claim 1.

7. The clamp of claim 1, wherein the cooling fluid conduit comprises a single conduit which starts at an outer edge of the clamp, spirals inwardly towards a center of the clamp and then spirals outwardly towards the outer edge of the clamp.

8. A method of cooling a clamp configured to hold an object, the clamp including an electrode to which a voltage may be applied in order to secure the object to the clamp, the method comprising passing cooling fluid into an inlet of a cooling fluid conduit and removing hot cooling fluid from an outlet of the cooling fluid conduit, the method further comprising using a heater to locally heat the cooling fluid only adjacent to the inlet such that a temperature gradient between fluid adjacent to the inlet and fluid that is approaching the outlet is reduced.

* * * * *